(12) United States Patent
Lee et al.

(10) Patent No.: US 8,315,120 B2
(45) Date of Patent: Nov. 20, 2012

(54) SEMICONDUCTOR MEMORY DEVICE AND METHOD OF DRIVING THE SAME

(75) Inventors: Cheol Ha Lee, Suwon-si (KR); Jong Doo Joo, Seongnam-si (KR); Jung-Han Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 190 days.

(21) Appl. No.: 12/976,472

(22) Filed: Dec. 22, 2010

(65) Prior Publication Data

US 2011/0188333 A1 Aug. 4, 2011

(30) Foreign Application Priority Data

Feb. 4, 2010 (KR) .................. 10-2010-0010399

(51) Int. Cl.
*G11C 7/02* (2006.01)

(52) U.S. Cl. ........ 365/208; 365/207; 365/149; 365/154; 365/189.011; 365/202; 365/204; 365/205

(58) Field of Classification Search .................. 365/207, 365/208, 149, 154, 189.011, 202, 204, 205
See application file for complete search history.

(56) References Cited

U.S. PATENT DOCUMENTS

| 7,616,504 | B2 * | 11/2009 | Vo et al. ................... | 365/189.03 |
| 7,889,574 | B2 * | 2/2011 | Byeon et al. .............. | 365/189.06 |
| 2009/0122630 | A1 * | 5/2009 | Takahashi .................... | 365/207 |
| 2011/0141830 | A1 * | 6/2011 | Chi et al. ................. | 365/189.11 |

* cited by examiner

*Primary Examiner* — Fernando Hidalgo
(74) *Attorney, Agent, or Firm* — Myers Bigel Sibley & Sajovec, P.A.

(57) ABSTRACT

A semiconductor memory device can include a first driver configured to generate a pair of first sense amplifier driving signals having an activation period at a predetermined level during command execution; and a second driver that can be configured to generate a pair of second sense amplifier driving signals for increasing a driving strength of a pair of sense amplifiers when logic values of a pair of bit lines are constant during the command execution and decreasing the driving strength of the pair of sense amplifiers when the logic values of the pair of bit lines change.

20 Claims, 10 Drawing Sheets

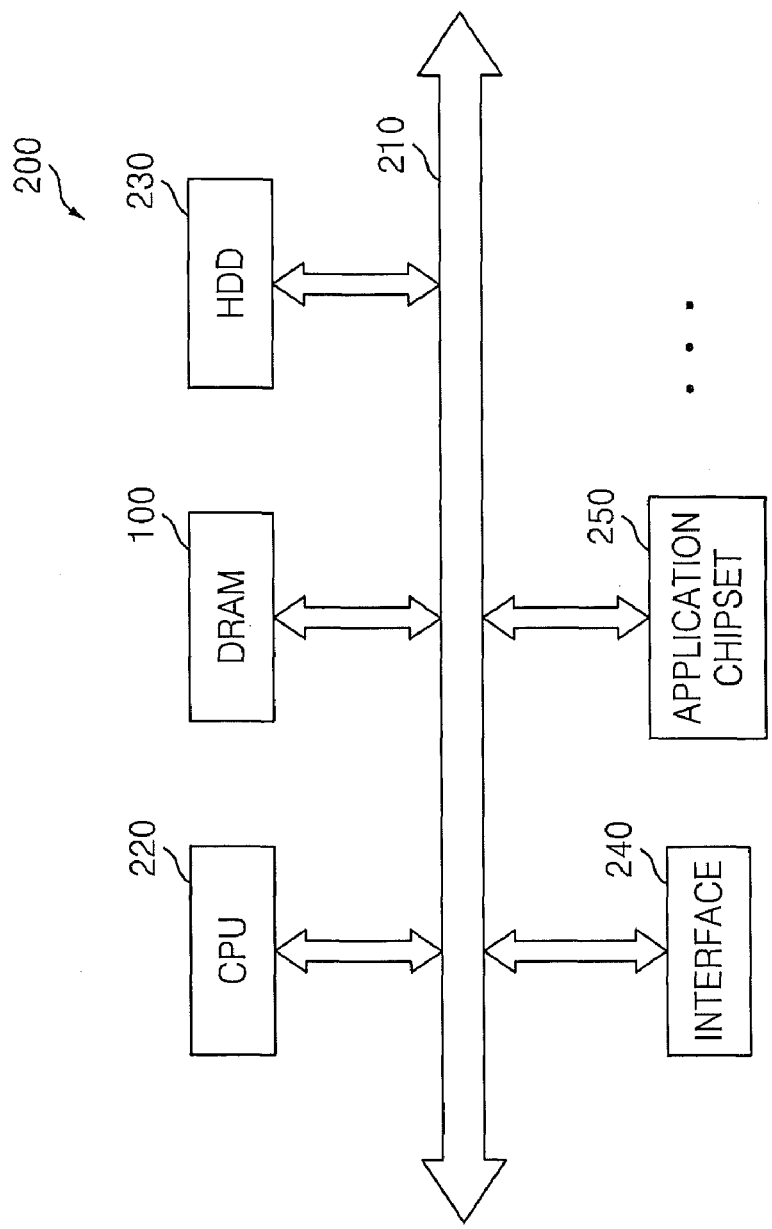

SEMICONDUCTOR MEMORY DEVICE AND METHOD OF DRIVING THE SAME

CROSS-REFERENCE TO RELATED APPLICATIONS

This application claims the benefit of Korean Patent Application No. 10-2010-0010399 filed on Feb. 4, 2010, in the Korean Intellectual Property Office, the disclosure of which is incorporated by reference herein in its entirety.

BACKGROUND

The present invention relates to semiconductor memory technology, and more particularly, to a semiconductor memory device for reading data from or writing data to a memory cell at high speed and a method of driving the same.

During execution of a read command or a write command on a memory cell in a semiconductor memory device, e.g., a dynamic random access memory (DRAM), logic values of a pair of bit lines connected to a pair of sense amplifiers vary. Execution of a read or write command may take longer when the logic values of the pair of bit lines vary compared to when the logic values of the bit lines do not need to vary. This can be caused because the sense amplifiers still operate during the command execution and tend to maintain existing logic values of the pair of bit lines.

Such operation of the sense amplifiers may hinder the performance (e.g., an operating speed) of DRAM from increasing.

To overcome this problem, methods of increasing the width of or decreasing the length of a transistor driving input/output data have been introduced. However, increasing the width of a transistor driving input/output data may increase the area of a memory core and may cause a read margin to be reduced due to a bump characteristic during a read operation, thereby reducing a yield.

SUMMARY

According to some embodiments of the present invention, there is provided a semiconductor memory device including a pair of sense amplifiers, a first driver, a second driver, a first switching unit, and a second switching unit.

The pair of sense amplifiers may be connected between a pair of bit lines and amplify and output a voltage difference between the pair of bit lines. The first driver may generate a pair of first sense amplifier driving signals activated based on an active command and block information corresponding to the pair of sense amplifiers. The second driver may generate a pair of second sense amplifier driving signals, which are activated based on the active command and the block information and have a deactivation period corresponding to a change period of logic values of the pair of bit lines during command execution. The first switching unit may apply a first power supply voltage and a second power supply voltage to the pair of sense amplifiers, respectively, in response to the pair of first sense amplifier driving signals. The second switching unit may apply the first power supply voltage and the second power supply voltage to the pair of sense amplifiers, respectively, in response to the pair of second sense amplifier driving signals.

When the change period of the logic values of the pair of bit lines occurs based on a read command and a write command which are sequentially executed, the pair of second sense amplifier driving signals may be deactivated based on a write enable signal and a command execution mode information which are generated based on the write command. The deactivation period of the pair of second sense amplifier driving signals may be within an activation period of a column selection signal for outputting a pair of data to the pair of bit lines during execution of the write command.

The semiconductor memory device may further include a third driver and a third switching unit. The third driver may generate a pair of third sense amplifier driving signals activated after the deactivation period of the pair of second sense amplifier driving signals. The third switching unit may apply the first power supply voltage and the second power supply voltage to the pair of sense amplifiers, respectively, in response to the pair of third sense amplifier driving signals.

When the change period of the logic values of the pair of bit lines occurs based on the read command and the write command which are sequentially executed, an activation period of the pair of third sense amplifier driving signals may be determined based on the write enable signal and the command execution mode information which are generated based on the write command.

The pair of sense amplifiers may include a first sense amplifier including a pair of first conductivity type transistors cross-coupled between the pair of bit lines and a second sense amplifier including a pair of second conductivity type transistors cross-coupled between the pair of bit lines. At this time, a connection node between the pair of first conductivity type transistors may be connected to a first power supply voltage line through the first through third switching units and a connection node between the pair of second conductivity type transistors may be connected to a second power supply voltage line through the first through third switching units.

Each of the first through third switching units may include a pair of transistors having different conductivity types, which transmit the first power supply voltage and the second power supply voltage to the pair of sense amplifiers, respectively, in response to a corresponding pair of sense amplifier driving signals, respectively, among the pairs of first through third sense amplifier driving signals.

According to other embodiments of the present invention, there is provided a semiconductor memory device including a pair of sense amplifiers, a first driver, a second driver, and a switching block.

The pair of sense amplifiers may be connected between a pair of bit lines and sense and amplify a voltage difference between the pair of bit lines. The first driver may generate a pair of first sense amplifier driving signals having an activation period at a predetermined level during command execution. The second driver may generate a pair of second sense amplifier driving signals for increasing a driving strength of the pair of sense amplifiers when logic values of the pair of bit lines are constant during the command execution and decreasing the driving strength of the pair of sense amplifiers when the logic values of the pair of bit lines change. The switching block may apply a first power supply voltage and a second power supply voltage to the pair of sense amplifiers, respectively, in response to the pair of first sense amplifier driving signals and the pair of second sense amplifier driving signals.

When a read command and a write command are sequentially executed, the second driver may generate the pair of second sense amplifier driving signals that have an activation period at a predetermined level based on an active command and block information corresponding to the pair of sense amplifiers when the logic values of the pair of bit lines are constant and the second driver may generate the pair of second sense amplifier driving signals that have a deactivation period corresponding to a change period of the logic values of the pair of bit lines based on a write enable signal and command execution mode information, which are generated based on the write command, when the logic values of the pair of bit lines change.

The semiconductor memory device may further include a third driver and a switching unit. The third driver may generate a pair of third sense amplifier driving signals activated after the deactivation period of the pair of second sense amplifier driving signals to increase the driving strength of the pair of sense amplifiers. The switching unit may apply the first power supply voltage and the second power supply voltage to the pair of sense amplifiers, respectively, in response to the pair of third sense amplifier driving signals.

According to further embodiments of the present invention, there is provided a method of driving a semiconductor memory device. The method includes amplifying a voltage difference between a pair of bit lines using a pair of sense amplifiers connected between the pair of bit lines; generating a pair of first sense amplifier driving signals activated based on an active command and block information corresponding to the pair of sense amplifiers; and generating a pair of second sense amplifier driving signals which are activated based on the active command and the block information and have a deactivation period corresponding to a change period of logic values of the pair of bit lines during command execution. The amplifying the voltage difference includes applying a first power supply voltage and a second power supply voltage to the pair of sense amplifiers, respectively, in response to the pair of first sense amplifier driving signals; and applying the first power supply voltage and the second power supply voltage to the pair of sense amplifiers, respectively, in response to the pair of second sense amplifier driving signals.

When the change period of the logic values of the pair of bit lines occurs based on a read command and a write command which are sequentially executed, the pair of second sense amplifier driving signals may be deactivated based on a write enable signal and a command execution mode information which are generated based on the write command.

According to further embodiments of the present invention, there is provided a method of driving a semiconductor memory device. The method includes sensing and amplifying a voltage difference between a pair of bit lines using a pair of sense amplifiers connected between the pair of bit lines; generating a pair of first sense amplifier driving signals having an activation period at a predetermined level during command execution; and generating a pair of second sense amplifier driving signals for increasing a driving strength of the pair of sense amplifiers when logic values of the pair of bit lines are constant during the command execution and decreasing the driving strength of the pair of sense amplifiers when the logic values of the pair of bit lines change. The sensing and amplifying the voltage difference includes applying a first power supply voltage and a second power supply voltage to the pair of sense amplifiers, respectively, in response to the pair of first sense amplifier driving signals and the pair of second sense amplifier driving signals.

The method may be implemented by executing a computer program for performing a computer system booting method stored in a computer readable recording medium.

BRIEF DESCRIPTION OF THE DRAWINGS

The above and other features and advantages of the present invention will become more apparent by describing in detail exemplary embodiments thereof with reference to the attached drawings in which:

FIG. 10 is a diagram of the structure of an electronic device according to some embodiments of the present invention.

DETAILED DESCRIPTION OF EMBODIMENTS ACCORDING TO THE INVENTIVE CONCEPT

Figure 1:
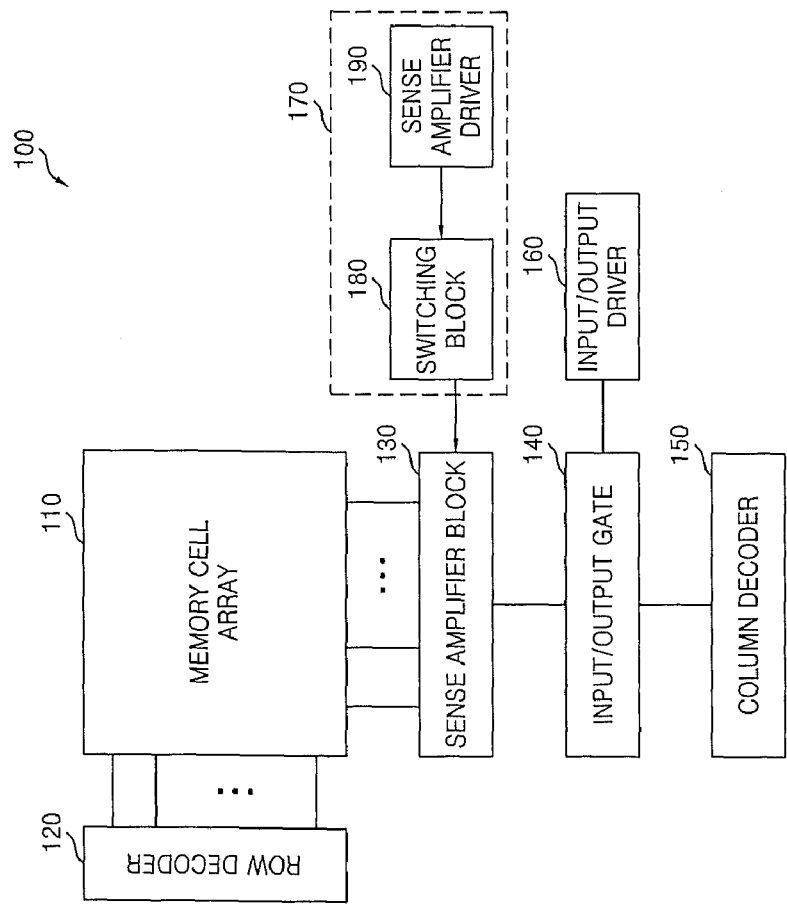
FIG. 1 is a block diagram of a semiconductor memory device according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a semiconductor memory device 100 according to some embodiments of the present invention. The semiconductor memory device 100 includes a memory cell array 110, a row decoder 120, a sense amplifier block 130, an input/output gate 140, a column decoder 150, an input/output driver 160, and a sense amplifier driving block 170.

The memory cell array 110 includes a plurality of memory cells (not shown) arranged in a matrix form. Each of the memory cells may include an access transistor functioning as a switch and a capacitor retaining a data bit. In other words, the semiconductor memory device 100 may be a dynamic random access memory (DRAM). Hereinafter, the semiconductor memory device 100 is assumed to be a DRAM, but the scope of the present invention is not restricted thereto.

When a row address is received, the row address is decoded into a row address signal by the row decoder 120 and a word line corresponding to the row address signal is activated by the row decoder 120. As a result, access transistors of all memory cells connected to the activated word line are turned on. Charges stored at a capacitor of each of the memory cells connected to the activated word line flow to a bit line connected to the capacitor.

The sense amplifier block 130 includes a plurality of sense amplifiers (not shown) which sense and amplify a voltage change in a bit line which is a very small due to small capacitance of a capacitor used in a memory device. Each of the sense amplifiers applies a first power supply voltage (e.g., a ground voltage) to a bit line with lower voltage between a pair of bit lines and a second power supply voltage to the other bit line with higher voltage in response to a sense amplifier driving signal received from the sense amplifier driving block 170, thereby sensing data of a memory cell.

The sense amplifier driving block 170 generates a sense amplifier driving signal different from that provided to a sense amplifier of a conventional semiconductor memory device in order to increase an operating speed and reliability of command execution by improving the sense amplifier operating characteristic of maintaining existing data logic values of a pair of bit lines during command execution of the semiconductor memory device 100. The operation of the sense amplifier driving block 170 will be described in detail with reference to FIGS. 2 through 8 later. Only one signal among amplified bit line signals is output to the input/output driver 160 through the input/output gate 140 corresponding to a column address decoded by the column decoder 150.

Figure 2:
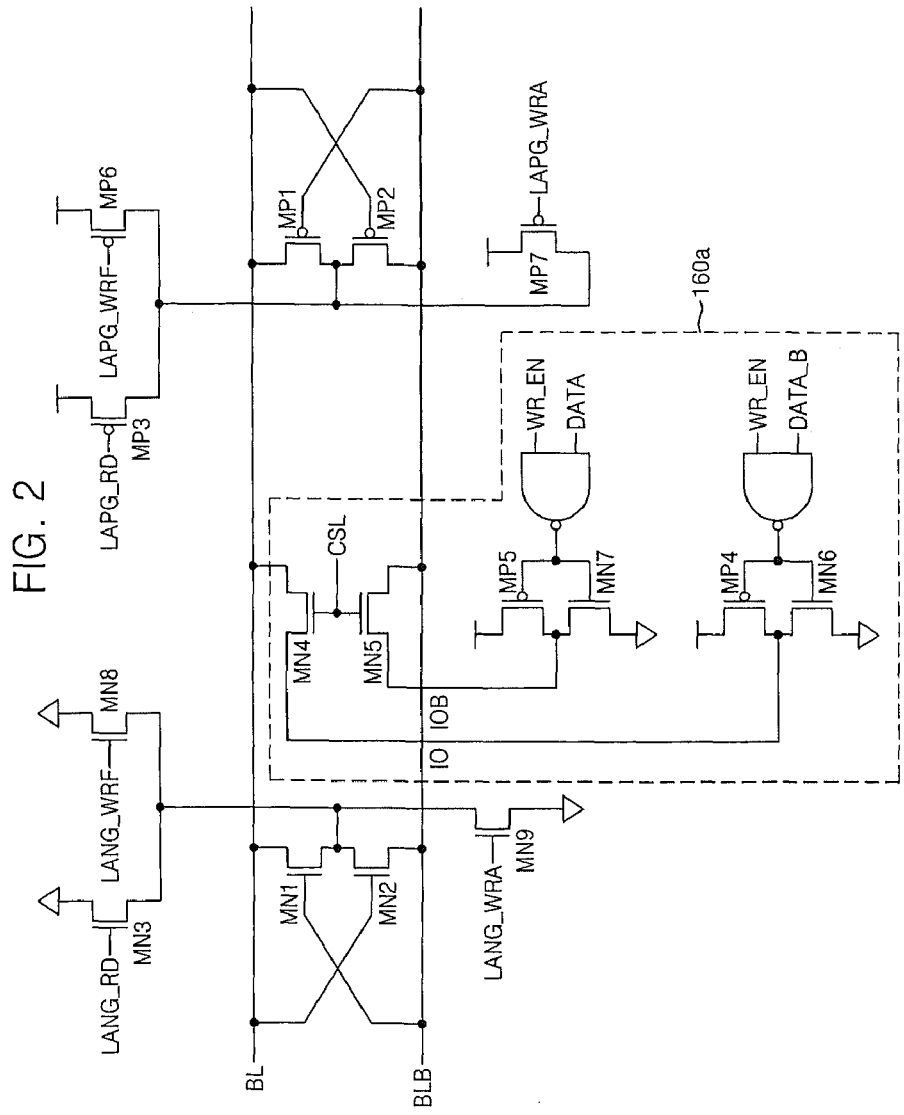
FIG. 2 is a circuit diagram of a part of a sense amplifier block and input/output driver illustrated in FIG. 1.
Figure 3:
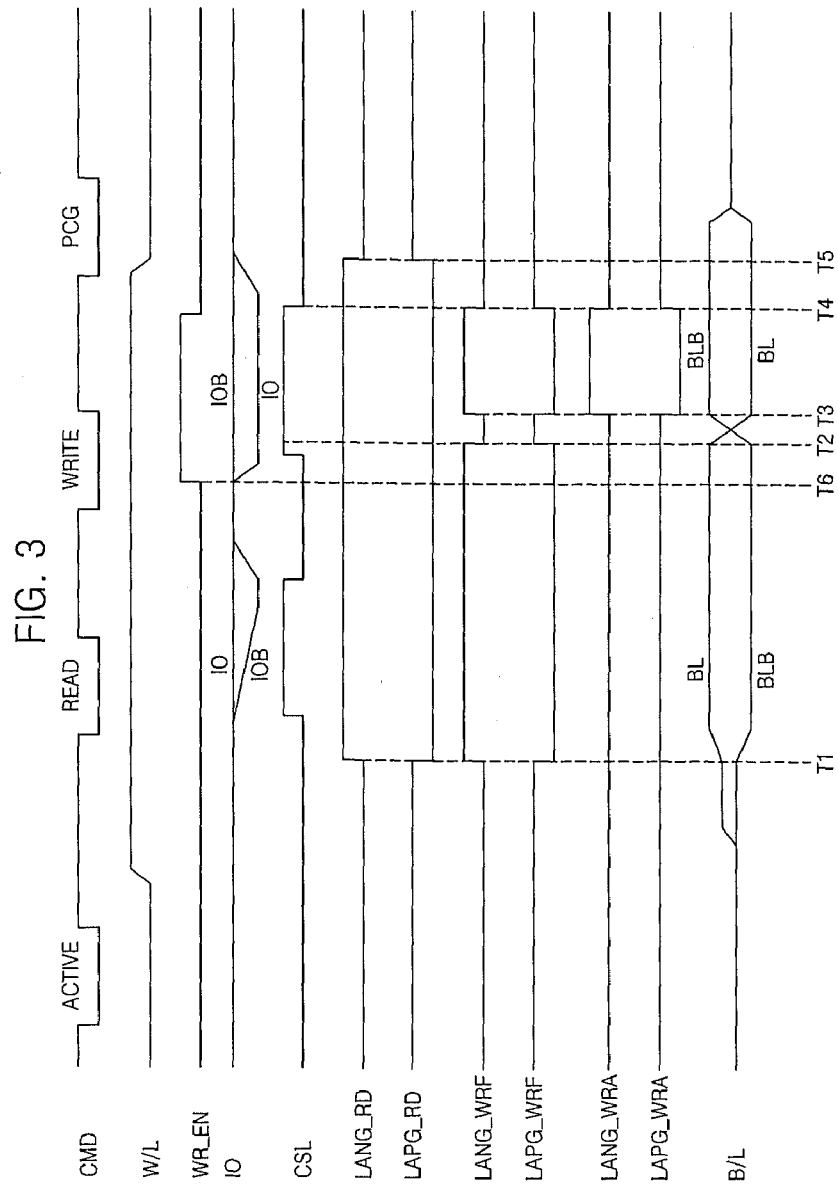
FIG. 3 is a timing diagram illustrating the operation of the semiconductor memory device illustrated in FIG. 1.
Figure 4:
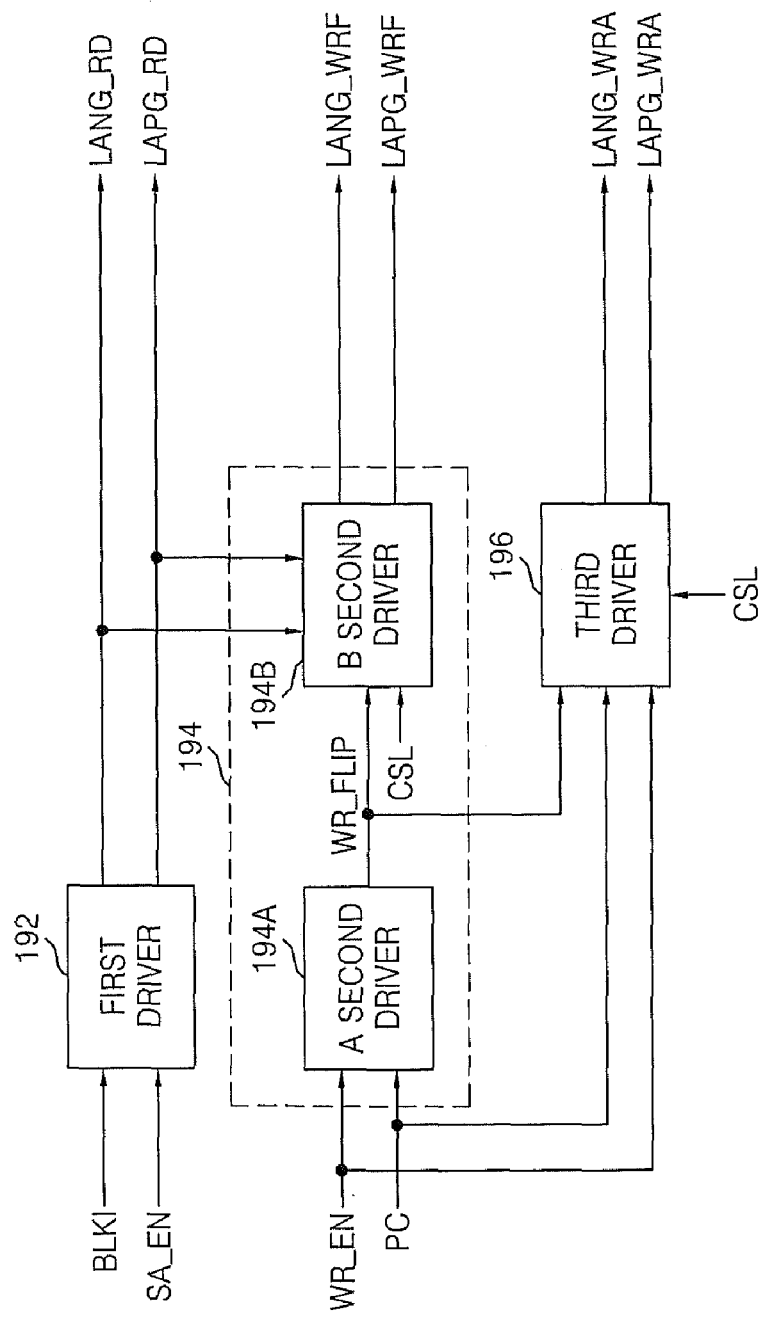
FIG. 4 is a block diagram of a sense amplifier driving block illustrated in FIG. 1.

FIG. 2 is a circuit diagram of a part of the sense amplifier block 130 and the input/output driver 160 illustrated in FIG. 1. FIG. 2 shows only a single pair of sense amplifiers (MN1, MN2, MP1, MP2) necessary to explain the principle of the present invention in the sense amplifier block 130. FIG. 3 is a timing chart illustrating the operation of the semiconductor memory device 100 illustrated in FIG. 1. FIG. 4 is a block diagram of the sense amplifier driving block 170 illustrated in FIG. 1.

The pair of sense amplifiers (MN1, MN2, MP1, MP2) are connected between a pair of bit lines BL and BLB and amplify a voltage difference between the bit lines BL and BLB. The pair of sense amplifiers (MN1, MN2, MP1, MP2) include a first sense amplifier (MN1, MN2) and a second sense amplifier (MP1 and MP2).

The first sense amplifier (MN1, MN2) may apply a ground voltage VSS to a bit line with lower voltage between the bit lines BL and BLB during execution of a read or write command. The first sense amplifier (MN1, MN2) includes a pair of first conductivity type transistors, e.g., N-type metal-oxide semiconductor (NMOS) transistors, MN1 and MN2 cross-coupled between the bit lines BL and BLB. The second sense amplifier (MP1, MP2) may apply a power supply voltage VDD to a bit line with higher voltage between the bit lines BL and BLB during execution of a read or write command. The second sense amplifier (MP1, MP2) includes a pair of second conductivity type transistors, e.g., P-type metal-oxide semiconductor (PMOS) transistors, MP1 and MP2 cross-coupled between the bit lines BL and BLB.

A connection node LAB between the first conductivity type transistors MN1 and MN2 is connected to a first power supply line, e.g., a ground voltage line, VSS by first through third switching units (MN3, MP3, MN8, MP6, MN9, MP7). A connection node LA between the second conductivity type transistors MP1 and MP2 is connected to a second power supply line, e.g., a power supply voltage line, VDD by the first through third switching units (MN3, MP3, MN8, MP6, MN9, MP7).

The sense amplifier driving block 170 includes a sense amplifier driver 190 and a switching block 180. The sense amplifier driver 190 generates a plurality of sense amplifier driving signals LANG_RD, LAPG_RD, LANG_WRF, LAPG_WRF, LANG_WRA, and LAPG_WRA for controlling the operations of the pair of the sense amplifiers (MN1, MN2, MP1, MP2). The switching block 180 applies the ground voltage VSS or the power supply voltage VDD to the pair of the sense amplifiers (MN1, MN2, MP1, MP2) in response to the sense amplifier driving signals LANG_RD, LAPG_RD, LANG_WRF, LAPG_WRF, LANG_WRA, and LAPG_WRA.

Referring to FIGS. 2 and 4, the sense amplifier driver 190 includes a first driver 192, a second driver 194, and a third driver 196. The switching block 180 includes the first switching unit (MN3, MP3), the second switching unit (MN8, MP6), and the third switching unit (MN9, MP7).

The first driver 192 generates a pair of first sense amplifier driving signals LANG_RD and LAPG_RD activated based on an external active command and block information BLKI corresponding to the pair of the sense amplifiers (MN1, MN2, MP1, MP2). The block information BLKI corresponding to the pair of the sense amplifiers (MN1, MN2, MP1, MP2) indicates an address of a block connected to the pair of the sense amplifiers (MN1, MN2, MP1, MP2) among the plurality of memory cells included in the memory cell array 110.

The first sense amplifier driving signals LANG_RD and LAPG_RD are generated based on a sense amplifier enable signal SA_EN activated after the active command is activated and the block information BLKI. The first sense amplifier driving signals LANG_RD and LAPG_RD may have an activation period from a point T1 to a point T5 at a predetermined level during execution of read and write commands, as illustrated in FIG. 3.

The second driver 194 generates a pair of second sense amplifier driving signals LANG_WRF and LAPG_WRF, which are activated based on the active command and the block information BLKI and have a deactivation period corresponding to a period from a point T2 to a point T3 while logic values of the bit lines BL and BLB change during command execution. If the logic values of the bit lines BL and BLB do not need to change during command execution, the second sense amplifier driving signals LANG_WRF and LAPG_WRF may have only an activation period at a predetermined level like the first sense amplifier driving signals LANG_RD and LAPG_RD.

The second sense amplifier driving signals LANG_WRF and LAPG_WRF are signals for controlling the driving strength of the pair of the sense amplifiers (MN1, MN2, MP1, MP2). When the logic values of the bit lines BL and BLB are constant during command execution, the second sense amplifier driving signals LANG_WRF and LAPG_WRF have an activation period always at a predetermined level, thereby enhancing the driving strength of the pair of the sense amplifiers (MN1, MN2, MP1, MP2).

However, when the logic values of the bit lines BL and BLB change during command execution, the second sense amplifier driving signals LANG_WRF and LAPG_WRF have a deactivation period to reduce the driving strength of the pair of the sense amplifiers (MN1, MN2, MP1, MP2) in consideration of the characteristic of the pair of the sense amplifiers (MN1, MN2, MP1, MP2) tending to maintain the logic values constant. At this time, the changing speed of the logic values of the bit lines BL and BLB increases in the deactivation period of the second sense amplifier driving signals LANG_WRF and LAPG_WRF, thereby increasing the command execution speed of the semiconductor memory device 100. In addition, since errors are decreased during command execution, reliability of the command execution is increased.

As illustrated in FIG. 3, when a change of the logic values of the bit lines BL and BLB occurs due to the sequential read and write commands, the second sense amplifier driving signals LANG_WRF and LAPG_WRF may be deactivated based on a write enable signal WR_EN generated in response to the write command and command execution mode information PC. The command execution mode information PC may indicate that a read or write command is being executed. The write enable signal WR_EN and the command execution mode information PC may be synchronized with a clock signal.

Figure 5:
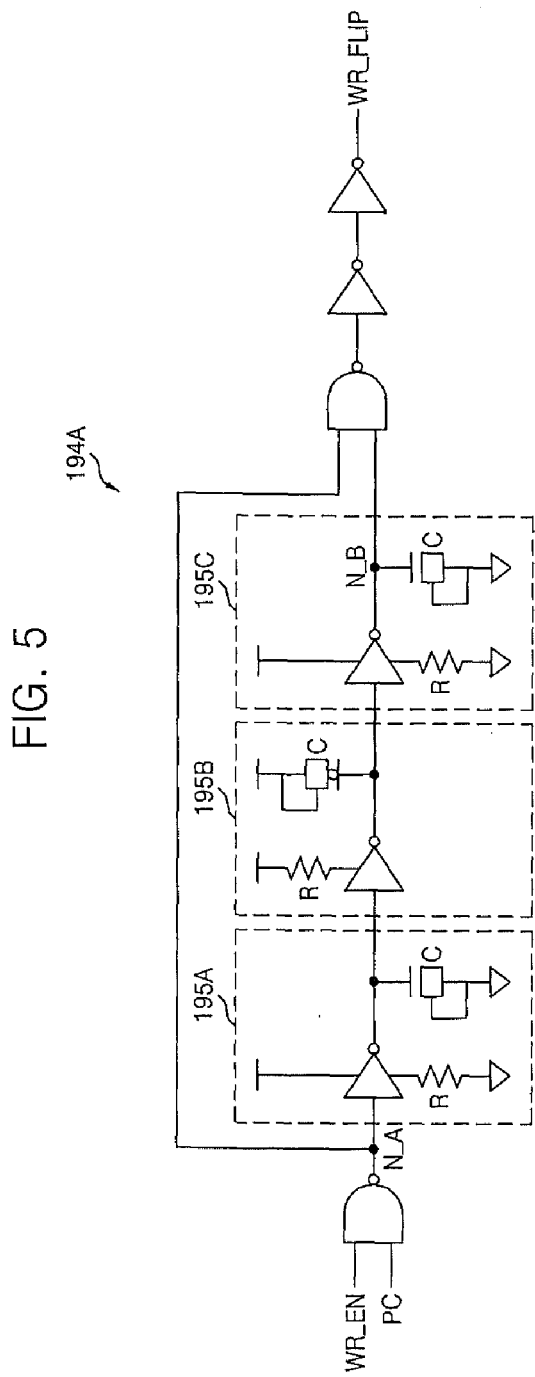
FIG. 5 is a circuit diagram of a part of a second driver illustrated in FIG. 4.
Figure 6:
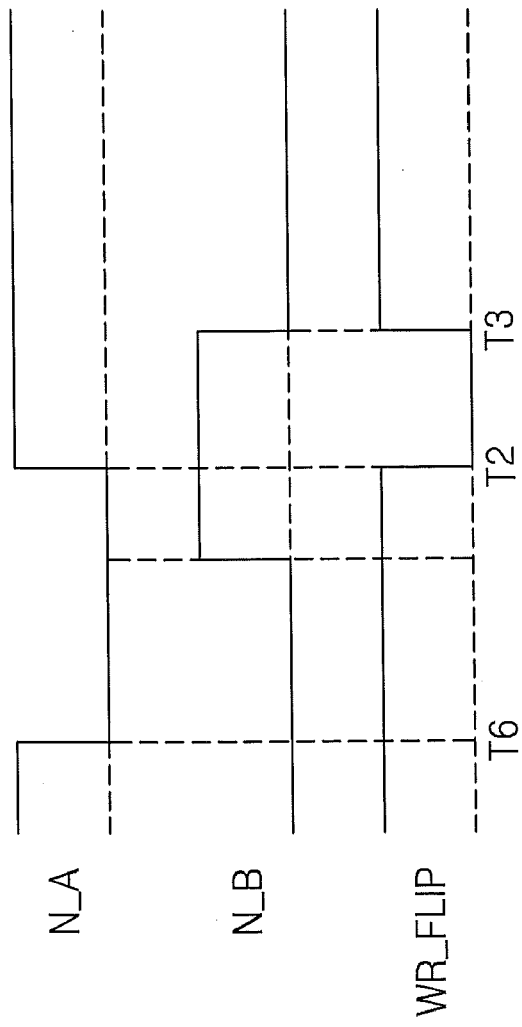
FIG. 6 is a timing diagram illustrating the operation of the second driver illustrated in FIG. 5.

FIG. 5 is a circuit diagram of a part of the second driver 194 illustrated in FIG. 4. FIG. 6 is a timing chart illustrating the operation of an A second driver 194A illustrated in FIG. 5. The A second driver 194A illustrated in FIG. 5 determines the deactivation period of the second sense amplifier driving signals LANG_WRF and LAPG_WRF. A procedure for determining the deactivation period of the second sense amplifier driving signals LANG_WRF and LAPG_WRF will be described with reference to FIGS. 5 and 6 below.

A NAND operation is performed on the write enable signal WR_EN and the command execution mode information PC. A NAND operation result N_A has a deactivation period from a point T6 to the point T2. The NAND operation result N_A is delayed by resistive-capacitive (RC) delay elements 195A, 195B, and 195C. A delay result N_B has an activation period partially overlapping the deactivation period of the NAND operation result N_A. A result WR_FLIP of performing a NAND operation on the NAND operation result N_A and the delay result N_B is a signal having the same deactivation period as the second sense amplifier driving signals LANG_WRF.

Although not shown in FIG. 6, a B second driver 194B corresponding to the remaining part of the second driver 194 performs an AND operation on the output signal WR_FLIP of the A second driver 194A, the first sense amplifier driving signal LANG_RD, and a column selection signal CSL to generate the second sense amplifier driving signal LANG_WRF activated at the point T1 and having an activation period from the point T1 to the point T2, a deactivation period from the point T2 to the point T3, and an activation period from the point T3 to a point T4.

The deactivation period of the second sense amplifier driving signal LANG_WRF generated by the operation of the B second driver 194E is within an activation period of the column selection signal CSL for outputting a pair of data to the bit lines BL and BLB, respectively, during execution of the write command. Those of ordinary skill in the art will easily infer a procedure of generating the other second sense amplifier driving signal LAPG_WRF from the above-described procedure for generating the second sense amplifier driving signal LANG_WRF. Thus, a description thereof will be omitted.

The third driver 196 generates the third sense amplifier driving signals LANG_WRA and LAPG_WRA activated after the deactivation period of the second sense amplifier driving signals LANG_WRF and LAPG_WRF to enhance the driving strength of the pair of the sense amplifiers (MN1, MN2, MP1, MP2) when the logic values of the bit lines BL and BLB change during command execution. In other words, while the third switching unit (MN9, MP7) is on, the command execution speed of the semiconductor memory device 100 is increased after completion of the change of the logic values of the bit lines BL and BLB and reliability of the command execution is increased.

Figure 7:
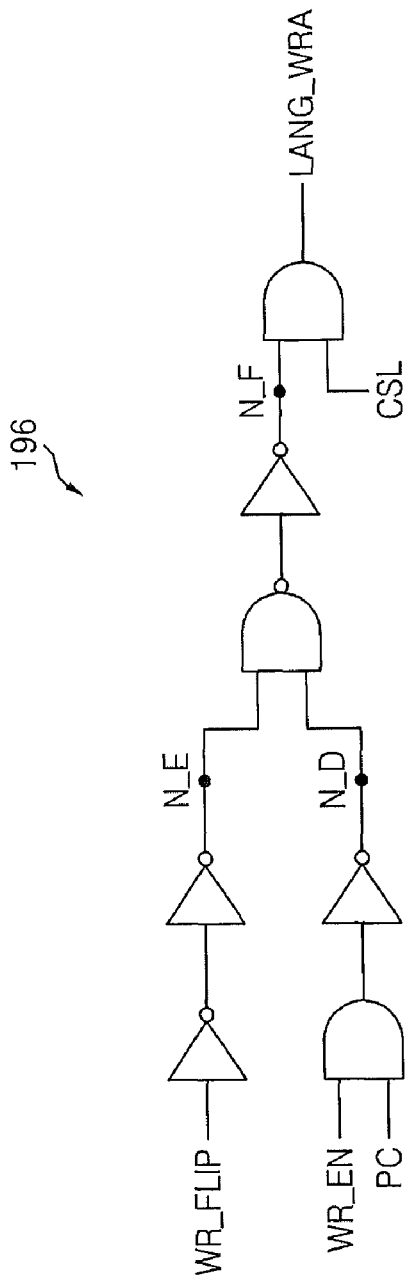
FIG. 7 is a circuit diagram of a third driver illustrated in FIG. 4.
Figure 8:
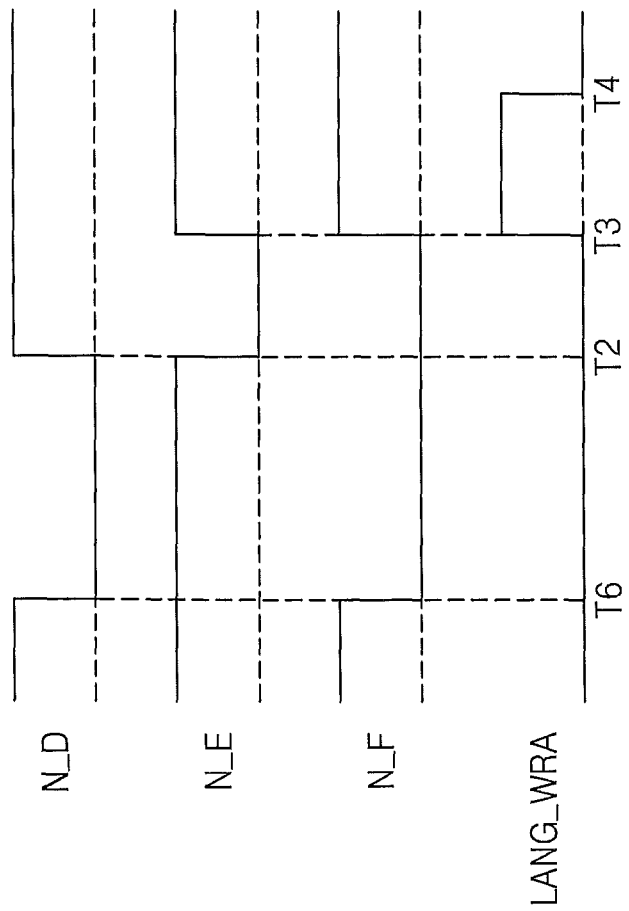
FIG. 8 is a timing diagram illustrating the operation of the third driver illustrated in FIG. 7.

FIG. 7 is a circuit diagram of the third driver 196 illustrated in FIG. 4. FIG. 8 is a timing chart illustrating the operation of the third driver 196 illustrated in FIG. 7. A procedure for generating the third sense amplifier driving signals LANG_RA and LAPG_WRA will be described with reference to FIGS. 7 and 8 below.

An AND operation is performed on the write enable signal WR_EN and the command execution mode information PC and a result of the AND operation is inverted. An inversion result N_D has a deactivation period from the point T6 to the point T2. The output signal WR_FLIP of the A second driver 194A is inverted two times. An inversion result N_E has a deactivation period from the point T2 to the point T3.

A NAND operation is performed on the inversion results N_D and N_E and then an inversion is performed. An inversion result N_F has a deactivation period from the point T6 to the point T3. An AND operation is performed on the inversion result N_F and the column selection signal CSL. An AND operation result is the third sense amplifier driving signal LANG_WRA having an activation period from the point T3 to the point T4.

Those of ordinary skill in the art will easily infer a procedure of generating the other third sense amplifier driving signal LAPG_WRA from the above-described procedure for generating the third sense amplifier driving signal LANG_WRA. Thus, a description thereof will be omitted.

Referring back to FIG. 2, the first switching unit (MN3, MP3) applies the ground voltage VSS and the power supply voltage VDD to the pair of the sense amplifiers (MN1, MN2, MP1, MP2), respectively, in response to the first sense amplifier driving signals LANG_RD and LAPG_RD. The second switching unit (MN8, MP6) applies the ground voltage VSS and the power supply voltage VDD to the pair of the sense amplifiers (MN1, MN2, MP1, MP2), respectively, in response to the second sense amplifier driving signals LANG_WRF and LAPG_WRF. The third switching unit (MN9, MP7) applies the ground voltage VSS and the power supply voltage VDD to the pair of the sense amplifiers (MN1, MN2, MP1, MP2), respectively, in response to the third sense amplifier driving signals LANG_WRA and LAPG_WRA.

Each of the first through third switching units (MN3, MP3, MN8, MP6, MN9, MP7) may include a pair of transistors having different conductivity types, i.e., an NMOS transistor and a PMOS transistor which transmit the ground voltage VSS and the power supply voltage VDD, respectively, in response to one pair of sense amplifier driving signals, respectively, among the first through third sense amplifier driving signals LANG_RD and LAPG_RD, LANG_WRF and LAPG_WRF, and LANG_WRA and LAPG_WRA.

A part 160a of the input/output driver 160 shown in FIG. 2 is a part for outputting data IO and IOB to the bit lines BL and BLB, respectively, in response to the column selection signal CSL during execution of the write command. The input/output driver 160 performs a NAND operation on each of data DATA and DATA B and the write enable signal WREN and inverts NAND operation results using inverters (MP5, MN7, MP4, MN6), thereby generating the data IO and IOB. The data IO and IOB are output to the bit lines BL and BLB through transistors MN4 and MN5, respectively, driven in response to the column selection signal CSL.

The operation of the semiconductor memory device 100 executing the read command and the write command will be described with reference to FIGS. 2 and 3 below.

When the active command is activated, a word line signal W/L is enabled and thus access transistors of memory cells subjected to the command are turned on. Thereafter, the first sense amplifier driving signals LANG_RD and LAPG_RD and the second sense amplifier driving signals LANG_WRF and LAPG_WRF are activated at the point T1. Then, the first switching unit (MN3, MP3) and the second switching unit (MN8, MP6) apply the ground voltage VSS and the power supply voltage VDD to the pair of the sense amplifiers (MN1, MN2, MP1, MP2) in response to the pair of the first sense amplifier driving signals LANG_RD and LAPG_RD and the pair of the second sense amplifier driving signals LANG_WRF and LAPG_WRF, respectively.

The pair of the sense amplifiers (MN1, MN2, MP1, MP2) are driven by a voltage of the bit lines BL and BLB receiving charges from the memory cells. The bit lines BL and BLB transit to the ground voltage VSS and the power supply voltage VDD. Since the column selection signal CSL is activated, the data IO and IOB sensed by the pair of the sense amplifiers (MN1, MN2, MP1, MP2) are output through the input/output driver 160. After the execution of the read command is completed, the first bit line BL is maintained at a logic value of "1" and the second bit line BLB is maintained at a logic value of "0".

Thereafter, when the write command is activated, the write enable signal WR_EN is activated at the point T6 and the column selection signal CSL is activated again. Then, the data IO having a logic value of "0" is output to the first bit line BL and the data IOB having a logic value of "1" is output to the second bit line BLB. When the data IO and IOB are output to the bit lines BL and BLB, respectively, the pair of the sense amplifiers (MN1, MN2, MP1, MP2) will be driven in response to the data IO and IOB and change the logic value of the first bit line BL from "1" to "0" and the logic value of the second bit line BLB from "0" to "1".

However, the pair of the sense amplifiers (MN1, MN2, MP1, MP2) are likely to maintain the logic value of the first bit line BL at "1" and the logic value of the second bit line BLB at "0" due to their characteristic. In other words, fighting occurs between the pair of the sense amplifiers (MN1, MN2, MP1, MP2) tending to maintain the logic values of the bit lines BL and BLB and the input/output driver 160 operating to change the logic values of the bit lines BL and BLB. At this time, in order to increase the speed and the reliability of the write command execution, the semiconductor memory device 100 decreases the driving strength of the pair of the sense amplifiers (MN1, MN2, MP1, MP2), thereby increasing the changing speed of the logic values of the bit lines BL and BLB.

Referring to FIG. 3, the semiconductor memory device 100 deactivates the second sense amplifier driving signals LANG_ WRF and LAPG_WRF applied to the pair of the sense amplifiers (MN1, MN2, MP1, MP2) during the change period from the point T2 to the point T3 while the logic values of the bit lines BL and BLB change in order to increase the changing speed of the logic values of the bit lines BL and BLB.

A period from the point T3 when the change of the logic values of the bit lines BL and BLB is completed to the point T4, the third sense amplifier driving signals LANG_WRA and LAPG_WRA are activated to increase the weakened driving strength of the pair of the sense amplifiers (MN1, MN2, MP1, MP2), thereby enhancing a write-restore operation. Since the driving strength of the pair of the sense amplifiers (MN1, MN2, MP1, MP2) is increased by the third sense amplifier driving signals LANG_WRA and LAPG_WRA, the speed and the reliability of write command execution can be increased.

The semiconductor memory device 100 according to some embodiments of the present inventive concept may be packed in various types of packages. For example, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

Figure 9:
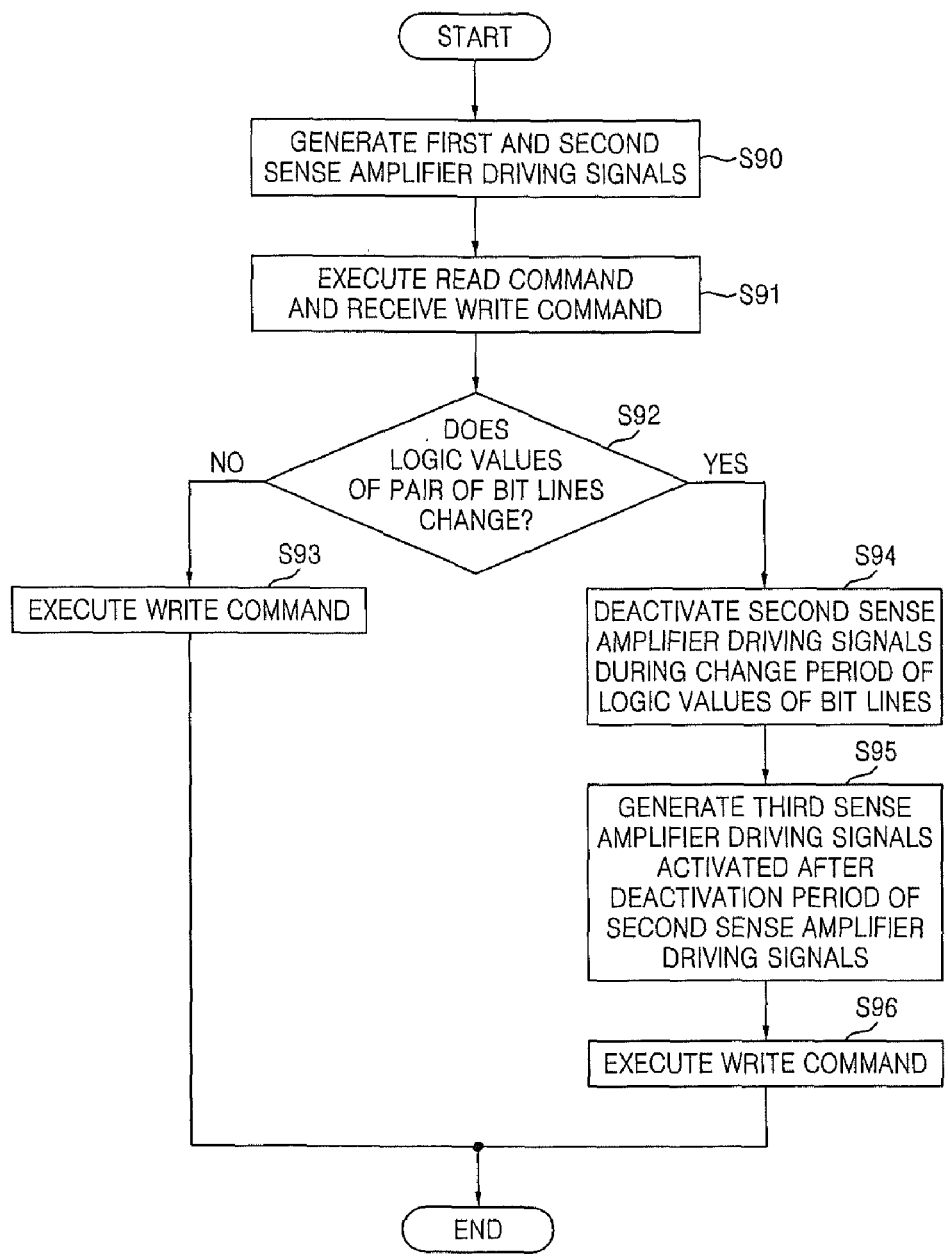
FIG. 9 is a flowchart of a method of driving a semiconductor memory device according to some embodiments of the present invention.

FIG. 9 is a flowchart of a method of driving the semiconductor memory device 100 according to some embodiments of the present invention. The method will be described in detail with reference to FIGS. 2, 3, and 9.

When a read command is enabled, the first sense amplifier driving signals LANG_RD and LAPG_RD and the second sense amplifier driving signals LANG_WRF and LAPG_ WRF are generated in operation S90. Then, the read command is executed and a write command is received in operation S91.

When the write command is received, the semiconductor memory device 100 determines whether the logic values of the bit lines BL and BLB change during the execution of the write command in operation S92. When it is determined that the logic values of the bit lines BL and BLB do not change, the semiconductor memory device 100 executes the write command based on the first sense amplifier driving signals LANG_RD and LAPG_RD and the second sense amplifier driving signals LANG_WRF and LAPG_WRF that do not have the deactivation period from the point T2 to the point T3 shown in FIG. 2 in operation S93.

However, whet it is determined that the logic values of the bit lines BL and BLB change, the second driver 194 generates the second sense amplifier driving signals LANG_WRF and LAPG_WRF having the deactivation period corresponding to the change period of the logic values of the bit lines BL and BLB in operation S94 and the third driver 196 generates the third sense amplifier driving signals LANG_WRA and LAPG_WRA activated after the deactivation period of the second sense amplifier driving signals LANG_WRF and LAPG_WRF in operation S95. Thereafter, the write command is executed based on the first sense amplifier driving signals LANG_RD and LAPG_RD, the second sense amplifier driving signals LANG_WRF and LAPG_WRF having the deactivation period, and the third sense amplifier driving signals LANG_WRA and LAPG_WRA in operation S96.

In the above-described embodiments of the present invention, the semiconductor memory device 100 increases the operating speed and reliability by controlling the driving strength of the pair of the sense amplifiers (MN1, MN2, MP1, MP2) when the logic values of the bit lines BL and BLB change while a read command and a write command are sequentially executed. However, the present invention is not restricted to these embodiments. For instance, controlling the driving strength of the pair of the sense amplifiers (MN1, MN2, MP1, MP2) to increase the speed and the reliability of the semiconductor memory device 100 may also be used when a read command is executed after execution of a write command.

FIG. 10 is a diagram of the structure of an electronic device 200 according to some embodiments of the present invention. Referring to FIG. 10, the electronic device 200 includes a central processing unit (CPU) 220, the semiconductor memory device, e.g., a DRAM, 100, a hard disk drive (HDD) 230, a user interface 240, and an application chipset 250, which are electrically connected to one another through a system bus 210.

The electronic device 200 may be a computing system, such as a notebook computer or a personal computer (PC), or a mobile device such as a cellular telephone, a personal digital assistant (PDA), a digital camera, a portable game console, or an MP3 player, but the present invention is not restricted thereto. The electronic device 200 may use the DRAM 100 as a memory device that temporarily stores data necessary for the operation of the electronic device 200. As described with reference to FIGS. 1 through 9, the DRAM 100 has faster and more reliable command execution performance than conventional DRAM. Accordingly, the electronic device 200 also has faster and more reliable operating characteristics than conventional electronic devices.

As described above, according to some embodiments of the present invention, the driving strength of a pair of sense amplifiers is temporarily weakened while the logic values of a pair of bit lines change, in order to improve the sense amplifiers' characteristic of maintaining the logic values of the bit lines constant during command execution, and then the driving strength of the sense amplifiers is re-increased, so that the operating speed and the command execution reliability of a semiconductor memory device are increased.

Some embodiments of the present inventive concept can be embodied in hardware, software, firmware or combination thereof. When the method of driving a semiconductor memory device 100 according to some embodiments of the present inventive concept is embodied in software, it can be embodied as computer readable codes or programs on a computer readable recording medium. The computer readable recording medium is any data storage device that can store data which can be thereafter read by a computer system. Examples of the computer readable recording medium may includes read-only memory (ROM), random-access memory (RAM), electrically erasable programmable ROM (EEPROM), and flash memory.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A semiconductor memory device comprising:
   a pair of sense amplifiers configured to be connected between a pair of bit lines and amplify and output a voltage difference between the pair of bit lines;
   a first driver configured to generate a pair of first sense amplifier driving signals activated based on an active command and block information corresponding to the pair of sense amplifiers;
   a second driver configured to generate a pair of second sense amplifier driving signals which are activated based on the active command and the block information and have a deactivation period corresponding to a change period of logic values of the pair of bit lines during command execution;
   a first switching unit configured to apply a first power supply voltage and a second power supply voltage to the pair of sense amplifiers, respectively, in response to the pair of first sense amplifier driving signals; and
   a second switching unit configured to apply the first power supply voltage and the second power supply voltage to the pair of sense amplifiers, respectively, in response to the pair of second sense amplifier driving signals.

2. The semiconductor memory device of claim 1, wherein when the change period of the logic values of the pair of bit lines occurs based on a read command and a write command which are sequentially executed, the pair of second sense amplifier driving signals are deactivated based on a write enable signal and a command execution mode information which are generated based on the write command.

3. The semiconductor memory device of claim 2, wherein the deactivation period of the pair of second sense amplifier driving signals is within an activation period of a column selection signal for outputting a pair of data to the pair of bit lines during execution of the write command.

4. The semiconductor memory device of claim 2, further comprising:
   a third driver configured to generate a pair of third sense amplifier driving signals activated after the deactivation period of the pair of second sense amplifier driving signals; and
   a third switching unit configured to apply the first power supply voltage and the second power supply voltage to the pair of sense amplifiers, respectively, in response to the pair of third sense amplifier driving signals.

5. The semiconductor memory device of claim 4, wherein when the change period of the logic values of the pair of bit lines occurs based on the read command and the write command which are sequentially executed, an activation period of the pair of third sense amplifier driving signals is determined based on the write enable signal and the command execution mode information which are generated based on the write command.

6. The semiconductor memory device of claim 4, wherein the pair of sense amplifiers comprise:
   a first sense amplifier comprising a pair of first conductivity type transistors cross-coupled between the pair of bit lines; and
   a second sense amplifier comprising a pair of second conductivity type transistors cross-coupled between the pair of bit lines,
   wherein a connection node between the pair of first conductivity type transistors is connected to a first power supply voltage line through the first through third switching units and a connection node between the pair of second conductivity type transistors is connected to a second power supply voltage line through the first through third switching units.

7. The semiconductor memory device of claim 4, wherein each of the first through third switching units comprises a pair of transistors having different conductivity types, which transmit the first power supply voltage and the second power supply voltage to the pair of sense amplifiers, respectively, in response to a corresponding pair of sense amplifier driving signals, respectively, among the pairs of first through third sense amplifier driving signals.

8. A semiconductor memory device comprising:
a pair of sense amplifiers configured to be connected between a pair of bit lines and sense and amplify a voltage difference between the pair of bit lines;
a first driver configured to generate a pair of first sense amplifier driving signals having an activation period at a predetermined level during command execution;
a second driver configured to generate a pair of second sense amplifier driving signals for increasing a driving strength of the pair of sense amplifiers when logic values of the pair of bit lines are constant during the command execution and decreasing the driving strength of the pair of sense amplifiers when the logic values of the pair of bit lines change; and
a switching block configured to apply a first power supply voltage and a second power supply voltage to the pair of sense amplifiers, respectively, in response to the pair of first sense amplifier driving signals and the pair of second sense amplifier driving signals.

9. The semiconductor memory device of claim 8, wherein when a read command and a write command are sequentially executed, the second driver generates the pair of second sense amplifier driving signals that have an activation period at a predetermined level based on an active command and block information corresponding to the pair of sense amplifiers when the logic values of the pair of bit lines are constant and the second driver generates the pair of second sense amplifier driving signals that have a deactivation period corresponding to a change period of the logic values of the pair of bit lines based on a write enable signal and command execution mode information, which are generated based on the write command, when the logic values of the pair of bit lines change.

10. The semiconductor memory device of claim 9, further comprising:
a third driver configured to generate a pair of third sense amplifier driving signals activated after the deactivation period of the pair of second sense amplifier driving signals to increase the driving strength of the pair of sense amplifiers; and
a switching unit configured to apply the first power supply voltage and the second power supply voltage to the pair of sense amplifiers, respectively, in response to the pair of third sense amplifier driving signals.

11. A method of driving a semiconductor memory device, the method comprising:
amplifying a voltage difference between a pair of bit lines using a pair of sense amplifiers connected between the pair of bit lines;
generating a pair of first sense amplifier driving signals activated based on an active command and block information corresponding to the pair of sense amplifiers; and
generating a pair of second sense amplifier driving signals which are activated based on the active command and the block information and have a deactivation period corresponding to a change period of logic values of the pair of bit lines during command execution,
wherein the amplifying the voltage difference comprises
applying a first power supply voltage and a second power supply voltage to the pair of sense amplifiers, respectively, in response to the pair of first sense amplifier driving signals; and
applying the first power supply voltage and the second power supply voltage to the pair of sense amplifiers, respectively, in response to the pair of second sense amplifier driving signals.

12. The method of driving the semiconductor memory of claim 11, wherein when the change period of the logic values of the pair of bit lines occurs based on a read command and a write command which are sequentially executed, the pair of second sense amplifier driving signals are deactivated based on a write enable signal and a command execution mode information which are generated based on the write command.

13. The method of driving the semiconductor memory of claim 12, wherein the deactivation period of the pair of second sense amplifier driving signals is within an activation period of a column selection signal for outputting a pair of data to the pair of bit lines during execution of the write command.

14. The method of driving the semiconductor memory of claim 12, further comprising:
generating a pair of third sense amplifier driving signals activated after the deactivation period of the pair of second sense amplifier driving signals; and
applying the first power supply voltage and the second power supply voltage to the pair of sense amplifiers, respectively, in response to the pair of third sense amplifier driving signals.

15. The method of driving the semiconductor memory of claim 14, wherein when the change period of the logic values of the pair of bit lines occurs based on the read command and the write command which are sequentially executed, an activation period of the pair of third sense amplifier driving signals is determined based on the write enable signal and the command execution mode information which are generated based on the write command.

16. The method of driving the semiconductor memory of claim 14, wherein the pair of sense amplifiers comprise:
a first sense amplifier comprising a pair of first conductivity type transistors cross-coupled between the pair of bit lines; and
a second sense amplifier comprising a pair of second conductivity type transistors cross-coupled between the pair of bit lines,
wherein a connection node between the pair of first conductivity type transistors is connected to a first power supply voltage line through a first through third switching units and a connection node between the pair of second conductivity type transistors is connected to a second power supply voltage line through the first through third switching units.

17. The method of driving the semiconductor memory of claim 14, wherein the applying the first power supply voltage and the second power supply voltage to the pair of sense amplifiers comprises
transmitting the first power supply voltage and the second power supply voltage to the pair of sense amplifiers, respectively, in response to a corresponding pair of sense amplifier driving signals, respectively, among the pairs of first through third sense amplifier driving signals.

18. A method of driving a semiconductor memory device, the method comprising:
- sensing and amplifying a voltage difference between a pair of bit lines using a pair of sense amplifiers connected between the pair of bit lines;
- generating a pair of first sense amplifier driving signals having an activation period at a predetermined level during command execution; and
- generating a pair of second sense amplifier driving signals for increasing a driving strength of the pair of sense amplifiers when logic values of the pair of bit lines are constant during the command execution and decreasing the driving strength of the pair of sense amplifiers when the logic values of the pair of bit lines change,
- wherein the sensing and amplifying the voltage difference comprises
- applying a first power supply voltage and a second power supply voltage to the pair of sense amplifiers, respectively, in response to the pair of first sense amplifier driving signals and the pair of second sense amplifier driving signals.

19. The method of driving the semiconductor memory of claim 18, wherein when a read command and a write command are sequentially executed, the pair of second sense amplifier driving signals that have an activation period at a predetermined level based on an active command and block information corresponding to the pair of sense amplifiers when the logic values of the pair of bit lines are constant and the pair of second sense amplifier driving signals that have a deactivation period corresponding to a change period of the logic values of the pair of bit lines based on a write enable signal and command execution mode information, which are generated based on the write command, when the logic values of the pair of bit lines change.

20. The method of driving the semiconductor memory of claim 19, further comprising:
- generating a pair of third sense amplifier driving signals activated after the deactivation period of the pair of second sense amplifier driving signals to increase the driving strength of the pair of sense amplifiers; and
- applying the first power supply voltage and the second power supply voltage to the pair of sense amplifiers, respectively, in response to the pair of third sense amplifier driving signals.

* * * * *